United States Patent
Kawai

(10) Patent No.: US 6,816,005 B2
(45) Date of Patent: Nov. 9, 2004

(54) ALL PASS FILTER

(75) Inventor: Kazuo Kawai, Tokyo (JP)

(73) Assignee: General Research of Electronics, Inc., Tokyo (JP)

( * ) Notice: Subject to any disclaimer, the term of this patent is extended or adjusted under 35 U.S.C. 154(b) by 0 days.

(21) Appl. No.: 10/292,107

(22) Filed: Nov. 12, 2002

(65) Prior Publication Data

US 2003/0090315 A1 May 15, 2003

(30) Foreign Application Priority Data

Nov. 13, 2001 (JP) ........................................ 2001-347174

(51) Int. Cl.[7] .................................................. H03K 5/00
(52) U.S. Cl. ..................................... 327/552; 327/557
(58) Field of Search ................................. 327/552, 557, 327/553, 555, 556, 558, 559; 330/107, 106, 305

(56) References Cited

U.S. PATENT DOCUMENTS

| | | | | |
|---|---|---|---|---|
| 2,852,751 A | * | 9/1958 | Lundry | ..................... 333/28 R |
| 3,581,122 A | * | 5/1971 | Gaunt, Jr. | ..................... 327/231 |
| 4,381,487 A | * | 4/1983 | Erickson | ..................... 330/306 |
| 4,518,878 A | * | 5/1985 | Moulding | ..................... 327/231 |
| 5,530,391 A | * | 6/1996 | Bohme et al. | ..................... 327/311 |

* cited by examiner

Primary Examiner—Dinh T. Le
(74) Attorney, Agent, or Firm—Flynn, Thiel, Boutell & Tanis, P.C.

(57) ABSTRACT

An all pass filter capable of adjusting a center frequency and Q independently from one another, even in a high frequency band. In the filter, an input signal from an input terminal is applied to a gain control circuit and a subtraction circuit, and after a gain of an output signal of a tuning circuit is adjusted by a resistor dividing circuit, it is amplified by a first transistor in phase. An input signal not passing through the tuning circuit is amplified inversely by a second transistor. Since the transistors are connected to a common load resistor, the input signal and the output signal of the tuning circuit are subtracted and a difference voltage therebetween appears at the load resistor.

10 Claims, 8 Drawing Sheets

ALL PASS FILTER

BACKGROUND OF THE INVENTION

1. Field of the Invention

The present invention relates to an improvement of circuit construction of an all pass filter of second order used for equalization of necessary transmission characteristic in waveform transmission of a digital signal and the like.

2. Description of the Related Art

For equalization of a digital signal transmission waveform, it is necessary to equalize both characteristics of amplitude characteristics and group delay characteristics (or phase characteristics) but since equalization of the group delay characteristics is done after equalization of the amplitude characteristics, equalization by an all pass filter having flat amplitude characteristic is required. Also, as an equalizer for this purpose, there are an automatic equalizer and a fixed equalizer and here the fixed equalizer is adopted.

In a case that a group characteristics of comparatively low frequency band is equalized by a fixed equalizer, since various all pass filters using an operational amplifier (op-amp) are developed, it is equalized easily by using them. In these equalizers, since there is one which is able to change a center frequency of equalization characteristics (a center frequency of phase characteristics) and its Q independently with each other (or at least one of them independently), circuit adjustment is easy if they are used and in addition if that circuit is constituted by an active filter, it has a merit in circuit construction that it can be realized without an inductor.

However, in a case that group delay characteristics of such high frequency band that an op-amp can be used therein is equalized, an all pass circuit of passive type based on conventional circuit network theory or an all pass circuit is constituted by a transistor circuit.

In a case that the all pass circuit of passive type is utilized, since there is no such freedom that a center frequency or Q (or one of them) can be changed, which is possible in an all pass filter having an op-amp, if anyone of them is intended to change, all element values constituting a circuit must be changed and thus circuit adjustment becomes complicated and very inconvenient. Also, a suitable method for constituting an all pass filter by using a transistor circuit is not developed.

SUMMARY OF THE INVENTION

The object of the present invention is to provide an all pass filter capable of changing a center frequency thereof and Q independently with each other or anyone of them independently in such high frequency band that an op-amp can not be utilized.

In order to achieve the above object, the present invention proposes all pass filters having the following constructions.

(1) An all pass filter comprising a tuning circuit of series resonance type containing a Q adjusting resistor, a gain control circuit for an input signal applied to said tuning circuit, and a subtraction circuit for subtracting the input signal from an output signal of said tuning circuit.

(2) An all pass filter described in item (1) wherein said gain control circuit includes a resistor dividing circuit and a first amplifier circuit for in phase amplifying an output of said resistor dividing circuit, and said subtraction circuit includes a second amplifier circuit for inversely amplifying the input signal, a third amplifier circuit for in phase amplifying the output signal of said tuning circuit and a common load for the second and the third amplifier circuits.

(3) An all pass filter described in item (1) wherein said gain control circuit includes a resistor dividing circuit and a first amplifier circuit for in phase amplifying an output signal of said resistor dividing circuit, and said subtraction circuit a second amplifier circuit for inversely amplifying the input signal, a third amplifier circuit for in phase amplifying an output signal said tuning circuit and a resistor synthesizer circuit for synthesizing the output signals of said second and third amplifier circuits.

(4) An all pass filter comprising a tuning circuit of M connection parallel resonance type containing a Q adjusting resistor, a gain control circuit for an input signal applied to said tuning circuit, and an adder circuit for adding the input signal to an output signal of said tuning circuit.

(5) An all pass filter described in item (4) wherein said gain control circuit includes a resistor dividing circuit connected to a M connection coil of the tuning circuit, and the adder circuit a fourth amplifier circuit for in phase amplifying the, input signal, a fifth amplifier circuit for in phase amplifying an output signal of said tuning circuit and a common load for said fourth and fifth amplifier circuits.

(6) An all pass filter described in item (4) wherein said adder circuit includes a fourth amplifier circuit for in phase amplifying the input signal and a fifth amplifier circuit for in phase amplifying an output signal of said tuning circuit, and said gain control circuit includes a resistor synthesizer circuit connected to said fourth and fifth amplifier circuit.

(7) An all pass filter comprising a tuning circuit of M connection parallel resonance type containing a Q adjusting resistor, a gain control circuit for an input signal applied to said tuning circuit, and a subtraction circuit for subtracting an output signal of said tuning circuit from the input signal.

(8) An all pass filter described in item (7) wherein said gain control circuit includes a resistor dividing circuit, and said subtraction circuit includes a sixth amplifier circuit for inversely amplifying an output signal of said tuning circuit, a seventh amplifier circuit for in phase amplifying an output signal of said tuning circuit and a load in which an output difference current between said sixth amplifier circuit and said seventh amplifier circuits flows.

(9) An all pass filter comprising a tuning circuit of tap input and parallel resonance type containing a Q adjusting resistor, a gain control circuit for an input signal applied to said tuning circuit, and a subtraction circuit for subtracting an output signal of said tuning circuit from the input signal.

(10) An all pass filter described in item (9) wherein said gain control circuit includes a resistor dividing circuit, and said subtraction circuit includes a sixth amplifier circuit for inversely amplifying the input signal, a seventh amplifier circuit for in phase amplifying an output signal of said tuning circuit and a load in which an output difference current between said sixth amplifier circuit and said seventh amplifier circuit.

(11) An all pass filter comprising a tuning circuit of phase inversion and parallel resonance type containing a Q adjusting resistor, and a gain control circuit for a difference signal obtained by applying the input signal to an output signal of said tuning circuit.

(12) An all pass filter described in item (11) wherein said gain control circuit includes a resistor dividing circuit and an impedance converter is connected to an output side of said tuning circuit.

(13) An all pass filter comprising a tuning circuit of parallel resonance type containing a Q adjusting circuit, a single winding transformer having a tap terminal connected to said tuning circuit, and a gain control circuit for a difference signal obtained by applying an input signal to an output signal of said tuning circuit.

(14) An all pass filter according to item (13) wherein said gain control circuit includes a resistor synthesizer circuit and an impedance converter is connected to an output side of said tuning circuit.

DESCRIPTION OF THE PREFERRED EMBODIMENTS

Figure 1:
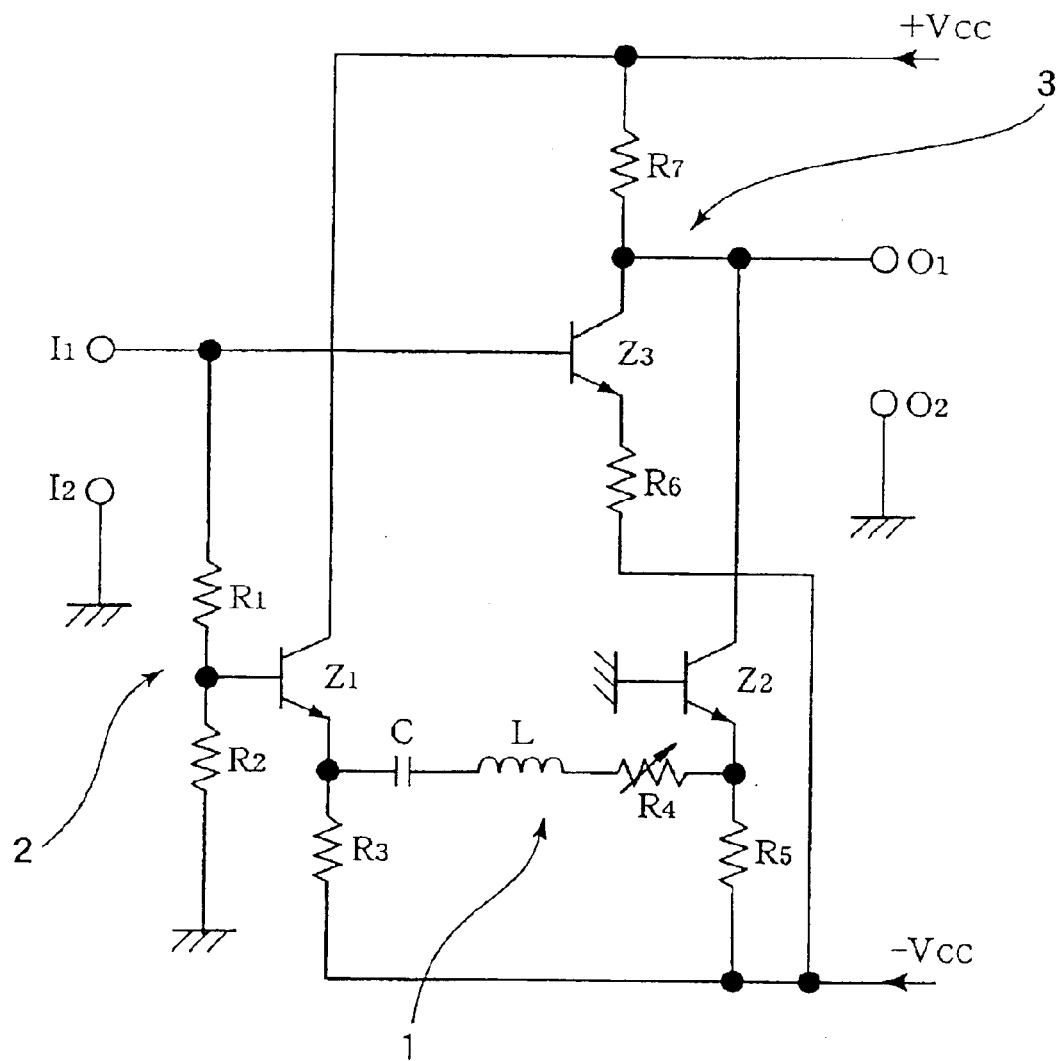
FIG. 1 is a circuit diagram showing a first embodiment of an all pass filter of the present invention.

A premise of the present invention to realize an all pass filter is that an op-amp can not be utilized but a transistor circuit can be utilized and further an inductor can be utilized instead of an op-amp.

An all pass filter can be realized by such circuit construction that an input signal having amplitude equal to ½ of a maximum output amplitude of a tuning circuit of series or parallel resonance type (an output amplitude when an input signal of a tuning frequency is applied thereto) is subtracted from an output signal thereof. This may be made clear by comparing the respective transfer functions of the tuning circuit and the all pass filter and this point will be explained as follows.

A transfer function $T_{APF}(s)$ of an all pass filter of second order as well known is $$T_{APF}(s) = \frac{s^2 - (\omega_0/Q)s + \omega_0^2}{s^2 + (\omega_0/Q)s + \omega_0^2} \quad (1)$$

where a gain coefficient is 1, s is a laplace transformer, $\omega_0$ is a center frequency and Q shows quality of a circuit.

A transfer function $T_{BPF}(s)$ of a band pass filter of second order is $$T_{BPF}(s) = \frac{(\omega_0/Q)s}{s^2 + (\omega_0/Q)s + \omega_0^2} \quad (2)$$

where a gain coefficient is 1.

Since an amplitude of an output signal is 1 when a signal of a center frequency is applied to this band pass filter, a transfer function $T_{NEW}(s)$ of a circuit so constructed that a signal having an amplitude of ½ of that of an input signal is subtracted from this output signal is $$T_{NEW}(s) = \frac{(\omega_0/Q)s}{s^2 + (\omega_0/Q)s + \omega_0^2} - \frac{(1/2)\{s^2 + (\omega_0/Q)s + \omega_0^2\}}{s^2 + (\omega_0/Q)s + \omega_0^2} \quad (3)$$

$$= -\frac{1}{2} \cdot \frac{s^2 - (\omega_0/Q)s + \omega_0^2}{s^2 + (\omega_0/Q)s + \omega_0^2} \quad (4)$$

and the equation (4) indicate that phase thereof is inverse and the gain coefficient ½ and thus an all pass filter is obtained.

Therefore, an all pass filter of the present invention can be constituted by a tuning circuit and a subtraction circuit. As the tuning circuit there are a series resonance circuit and a parallel resonance circuit and as a subtracting method of the subtraction circuit, there are the following two methods. That is, a first method is a method adding an inverse signal to a non-inverse signal, and a second method is a method obtaining a corrector current proportional to difference between both signals by applying two signals to a base and an emitter of a transistor respectively. An all pass filter of the present invention can be constituted by combining such tuning circuit and subtraction circuit.

In this case, for example, if a M connection circuit which is not a subtraction circuit having conventional construction is used as said tuning circuit, by selecting directions between the input and the output of the M connection circuit so that phase relation between the input and the output becomes inverse phase, an output signal of the tuning circuit becomes to have inverse phase relative to that of an input signal thereof, so that subtraction between the input and the output signals can be done by only adding the output signal to the input signal and thus it is unnecessary to provide a special subtraction circuit.

Each of embodiments of all pass filters based on the theory of the present invention described above will be explained as follows.

Figure 2:
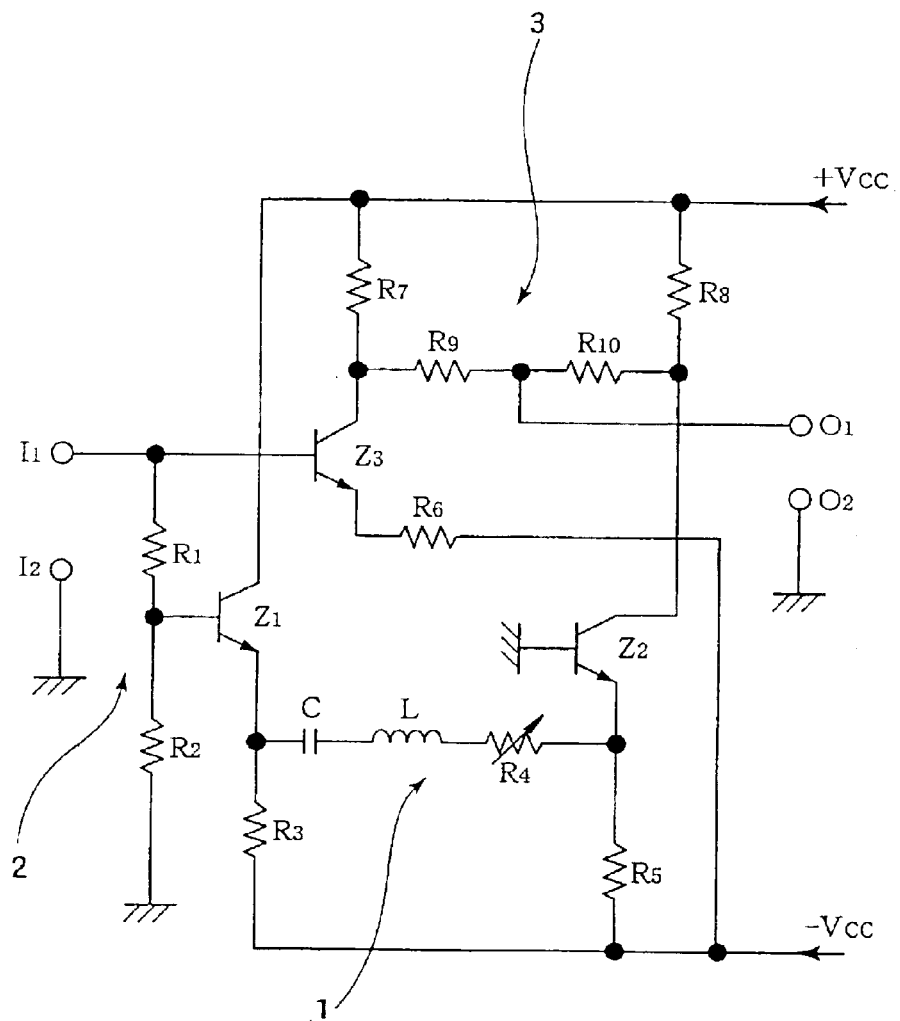
FIG. 2 is a circuit diagram showing a second embodiment of the present invention.

FIGS. 1 and 2 show first and second embodiments of all pass filters of the present invention using tuning circuits of series resonance type respectively.

In the first embodiment of FIG. 1, $I_1$ and $I_2$ are input terminals, $O_1$ and $O_2$ are output terminals, $R_1$ to $R_7$ are resistors, $Z_1$ to $Z_3$ are transistors, C is a capacitor for setting a tuning frequency, L is an inductor. Also, 1 is a tuning circuit constituted by said C, L and Q adjusting resistor $R_4$, 2 is a gain control circuit for an input signal applied to the tuning circuit 1 and said circuit 2 are constituted by a resistor dividing circuit consisting resistors $R_1$ and $R_2$, and a transistor $Z_1$ for amplification in phase. 3 is a subtraction circuit constituted by a transistor $Z_2$ for amplification in phase, a, transistor $Z_3$ for inverse amplification and a load resistor $R_7$ common to both transistors.

The input signal from the input terminals $I_1$ and $I_2$ is applied to the gain control circuit 2 and the subtraction circuit 3, and gain of an output signal of the tuning circuit 1 is adjusted by the gain control circuit and then is amplified in phase.

On the other hand, an input signal not passing through the tuning circuit, is amplified inversely but since correctors of said transistors $Z_2$, $Z_3$ are connected to the load resistor $R_7$ in common, subtraction between the input signal and an output signal of the tuning circuit, is done so that difference voltage component between both signals appears at $R_7$. Therefore, a circuit between the input terminals $I_1$, $I_2$ and the output terminals has all pass characteristics as is apparent from the above description wherein adjustment of a center frequency $f_0$ is done by the capacitor C and adjustment of Q is done by the resistor $R_4$, thereby to adjust $f_0$ and Q independently with each other.

In the second embodiment of FIG. 2, the same reference numerals as those in the first embodiment show the same or similar circuit components. Load resistors of the transistors $Z_2$, $Z_3$ are $R_7$, $R_8$ and an output signal is synthesized by the resistors $R_9$, $R_{10}$ and then is taken out. Amplitude adjustment for obtaining all pass characteristics is done by the resistor dividing circuit ($R_1$, $R_2$) or a resistor synthesizing circuit ($R_9$, $R_{10}$).

Figure 3:
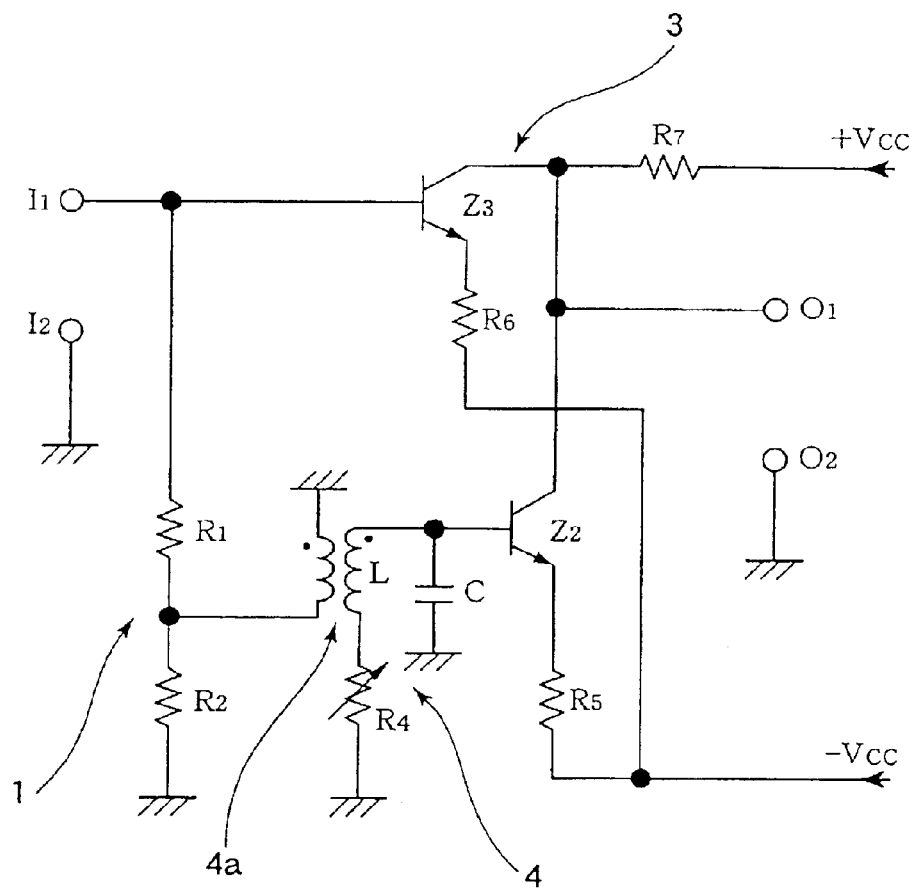
FIG. 3 is a circuit diagram showing a third embodiment of the present invention.
Figure 4:
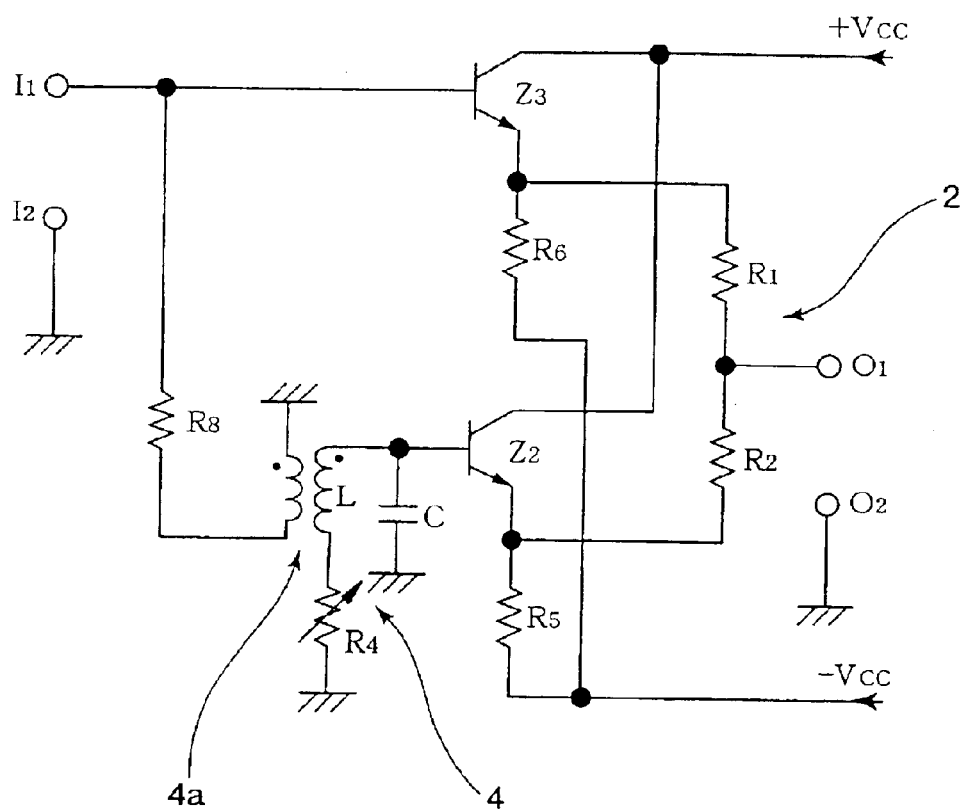
FIG. 4 is a circuit diagram showing a fourth embodiment of the present invention.

FIGS. 3 and 4 show third and fourth embodiments of all pass filters of the present invention using a tuning circuit 4 of phase inversion and M connection parallel resonance type respectively.

In the third embodiment of FIG. 3, since a M connection portion 4a of the tuning circuit 4 is connected so that phase difference between the input and the output therein is 180°, subtraction can done by adding the output signals of the transistors $Z_2$, $Z_3$. Correctors of both transistors are connected parallely and the difference voltage component appears at a resistor $R_7$.

The fourth embodiment of FIG. 4 is different from the third embodiment in that the output signals of said transistors $Z_2$, $Z_3$ are added by a resistor synthesizing circuit ($R_1$, $R_2$) constituting the gain control circuit 2. In the third and fourth embodiments, a center frequency $f_0$ and Q can be adjusted by a capacitor C and a resistor $R_4$ respectively.

Figure 5:
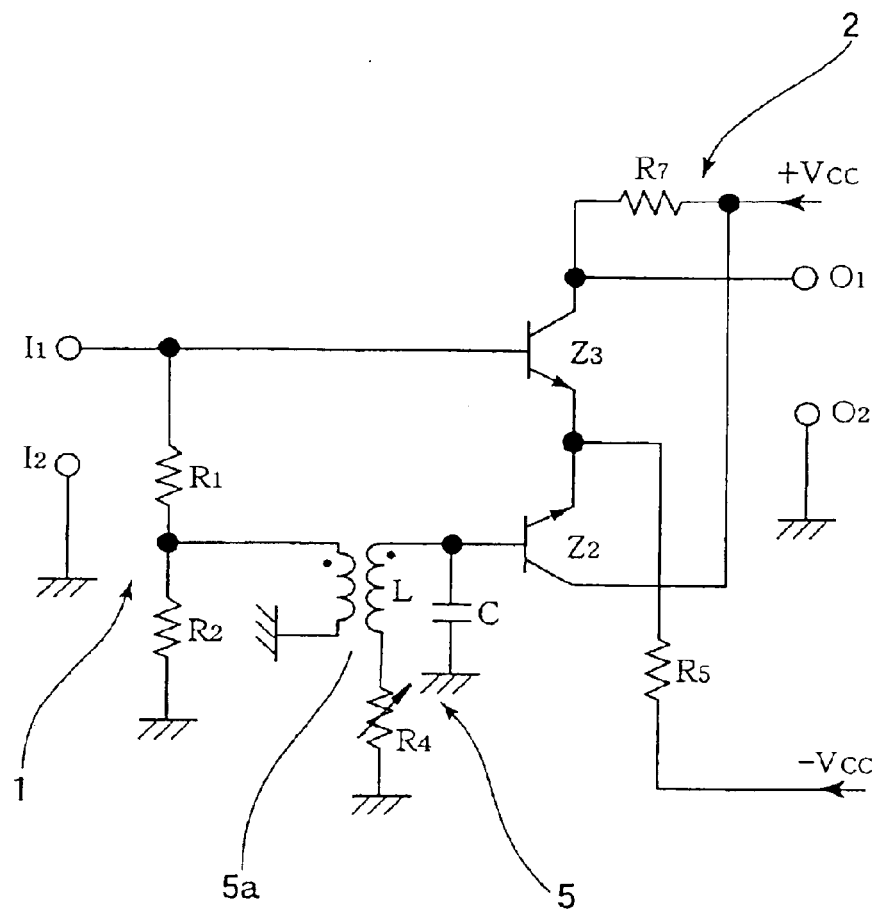
FIG. 5 is a circuit diagram showing a fifth embodiment of the present invention.

FIG. 5 shows a fifth embodiment of an all pass filter of the present invention using a tuning circuit 5 of M connection parallel resonance type. In the fifth embodiment of FIG. 5, phase inversion is not done in a M connection portion 5a. An output signal of the tuning circuit 5 is amplified in phase by deriving an emitter of a transistor $Z_3$ through an emitter follower transistor $Z_2$ and on the other hand an input signal applied to a base of the transistor $Z_2$ is amplified inversely. Therefore, a corrector current of $Z_2$ is subtracted in current domain and a difference voltage between the both signals appears at a resistor $R_7$.

Figure 6:
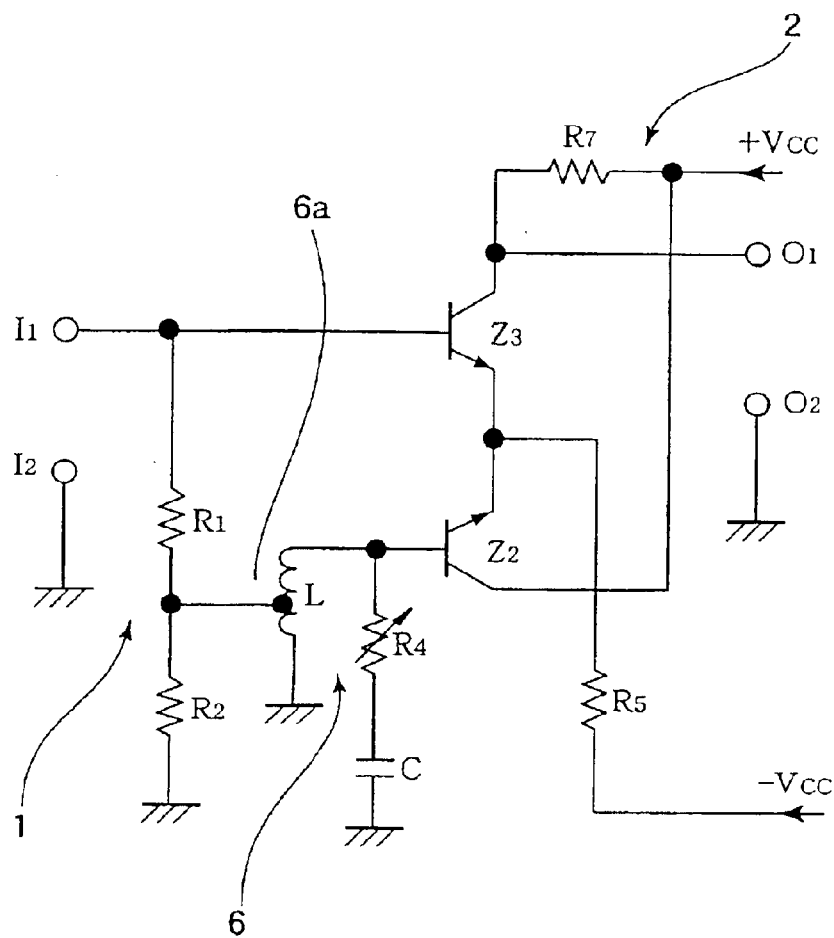
FIG. 6 is a circuit diagram showing a sixth embodiment of the present invention.

FIG. 6 shows a sixth embodiment of an all pass filter of the present invention using a tuning circuit 6 of tap input parallel resonance type. The sixth embodiment is different from the fifth embodiment in that an input thereof is a tap input 6a.

Figure 7:
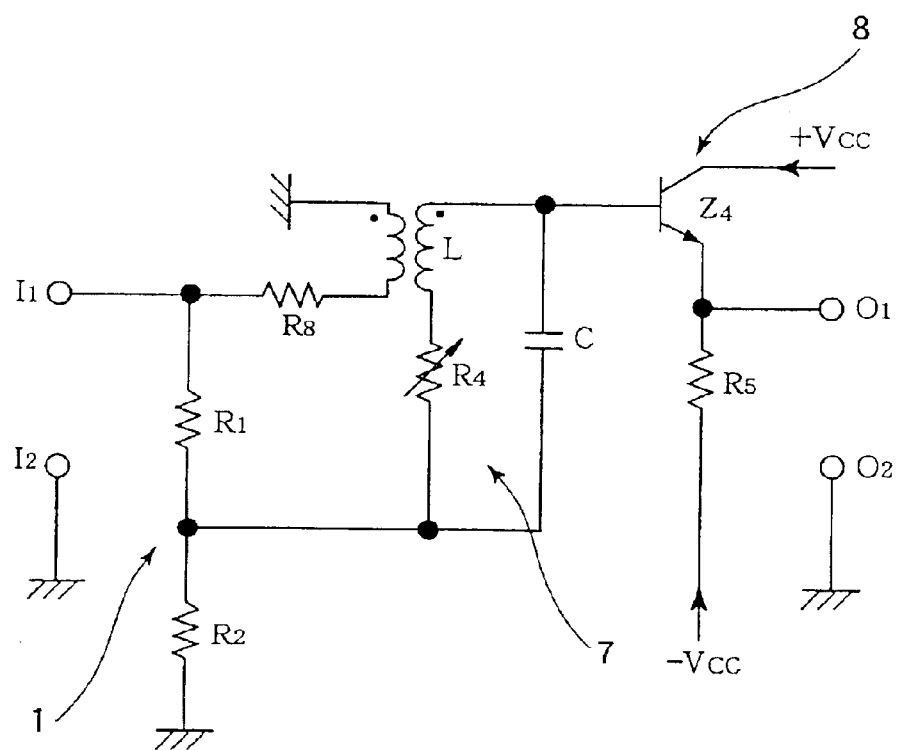
FIG. 7 is a circuit diagram showing a seventh embodiment of the present invention.

FIG. 7 shows a seventh embodiment of an all pass filter of the present invention using a tuning circuit of phase inversion M connection parallel resonance type. In the seventh embodiment of the FIG. 7, an input signal from input terminals $I_1$, $I_2$ is applied to the tuning circuit 7 and added to a phase inverted output signal of the tuning circuit 7 to subtract from it. In this construction all pass characteristics is obtained by a circuit consisting of only passive elements but since an impedance viewing from output terminals $O_1$, $O_2$ is high in such construction, an impedance converter 8 is used. For example, an emitter follower transistor $Z_4$ is used as the impedance converter 8.

Figure 8:
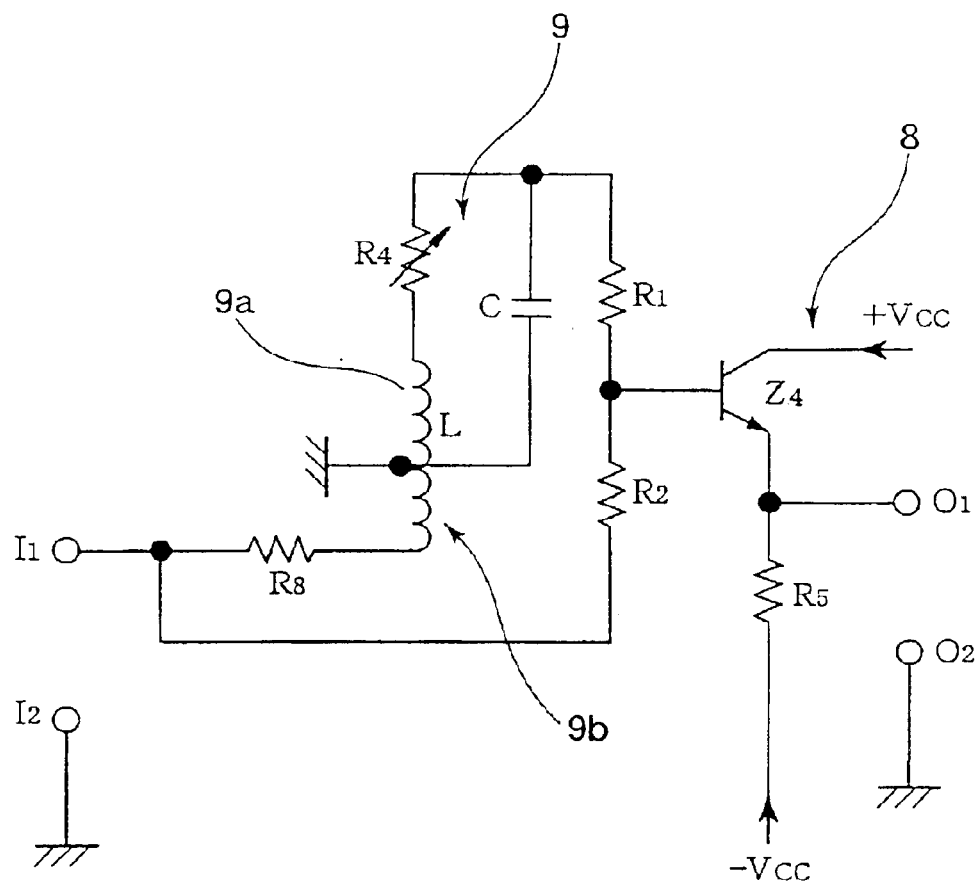
FIG. 8 is a circuit diagram showing a eighth embodiment of the present invention.

FIG. 8 shows an eighth embodiment of an all pass filter of the present invention using a tuning circuit 9 of parallel resonance type wherein a tap terminal of a coil L of a single winding transformer with taps is grounded. In the eighth embodiment of FIG. 8, an input signal from input terminals $I_1$, $I_2$ is applied to a winding 9a of a low impedance side of the coil L and a winding 9b of a high impedance side is connected to a capacitor C through a Q adjusting resistor $R_4$ to constitute a tuning circuit 9 of parallel resonance type. In this construction since an output signal of the tuning circuit 9 has inverse phase relative to that of an input signal, both signals are added by a resistor synthesizing circuit ($R_1$, $R_2$) so that the input signal is subtracted from the output signal. Therefore, an all pass characteristics is obtained by setting a synthesized resistor value of $R_1$, $R_2$ so that amplitudes of both signals become to have suitable values. Since this resistor synthesizing circuit is a load of the tuning circuit 9, adjustment of Q is done on the basis of a resistor value of this load.

As explained in the above, according to an all pass filter of the present invention, since a tuning circuit is used, adjustment of a center frequency can be done by adjusting capacity of a capacitor and adjustment of Q can be done by adjusting resistance value. Adjustment results of both are not influenced and independent one another.

Therefore, since the all pass filter is different from a conventional all pass filter using an op-amp in a low frequency band and uses an inductor but can adjust a center frequency and Q thereof independently with each other in a high frequency band and can be constituted by a simple circuit, thereby to equalize a digital signal waveform of high speed easily.

What is claimed is:

1. An all pass filter comprising:
   a tuning circuit of series resonance containing a Q adjusting resistor;
   a gain control circuit for receiving an input signal and providing an output to said tuning circuit; and
   a subtraction circuit for subtracting the input signal from an output signal of said tuning circuit.

2. An all pass filter according to claim 1, wherein said gain control circuit includes a resistor dividing circuit and a first amplifier circuit for in phase amplifying an output of said resistor dividing circuit, and said subtraction circuit includes a second amplifier circuit for inversely amplifying the input signal, a third amplifier circuit for in phase amplifying the output signal of said tuning circuit and a common load for the second and third amplifier circuits.

3. An all pass filter according to claim 1, wherein said gain control circuit includes a resistor dividing circuit and a first amplifier circuit for in phase amplifying an output signal of said resistor dividing circuit, and said subtraction circuit includes a second amplifier circuit for inversely amplifying the input signal, a third amplifier circuit for in phase amplifying the output signal of said tuning circuit and a resistor synthesizer circuit for synthesizing the output signals of said second and third amplifier circuits.

4. An all pass filter comprising:
   a tuning circuit of parallel resonance with M connection and containing a Q adjusting resistor;
   a gain control circuit for receiving an input signal and providing an output to said tuning circuit, said gain control circuit including a resistor dividing circuit connected to a M connection coil of the tuning circuit; and
   an adder circuit for adding the input signal to an output signal of said tuning circuit, said adder circuit comprising:
      a first amplifier circuit for in-phase amplification of the input signal,
      a second amplifier circuit for in-phase amplification of the output signal of said tuning circuit, and
      a common load for said first and second amplifier circuits.

5. An all pass filter comprising:
   a tuning circuit of parallel resistance with M connection containing, a Q adjusting resistor;
   an adder circuit for adding an input signal to an output signal of said tuning circuit including a first amplifier circuit for performing in phase amplification of the input signal and a second amplifier circuit for performing in phase amplification of the output signal of said tuning circuit; and a gain control circuit including a resister synthesizer circuit connected to said first amplifier circuit and said second amplifier circuit.

6. An all pass filter comprising:

a tuning circuit of parallel resonance with M connection and containing a Q adjusting resistor;

a gain control circuit for receiving an input signal and providing an output to said tuning circuit; and a subtraction circuit for subtracting an output signal of said tuning circuit from the input signal.

7. An all pass filter according to claim 6, wherein said gain control circuit includes a resistor dividing circuit, and said subtraction circuit includes a first amplifier circuit for inversely amplifying an output signal of said tuning circuit, a second amplifier circuit for in phase amplifying an output signal of said tuning circuit and a load in which an output difference current between said first amplifier circuit and said second amplifier circuits flows.

8. An all pass filter comprising:

a tuning circuit of parallel resonance having a tap input and containing a Q adjusting resistor;

a gain control circuit for receiving an input signal and providing an output to said tuning circuit; and a subtraction circuit for subtracting an output signal of said tuning circuit from the input signal.

9. An all pass filter according to claim 8, wherein said gain control circuit includes a resistor dividing circuit, and said subtraction circuit includes a first amplifier circuit for inversely amplifying the input signal, a second amplifier circuit for in phase amplification of the output signal of said tuning circuit and a load in which an output difference current between said first amplifier circuit and said second amplifier circuit flows.

10. An all pass filter comprising:

a tuning circuit having parallel resonance and containing a Q adjusting circuit;

a single winding transformer having a tap terminal connected to said tuning circuit and a single winding for receiving an input signal; and a gain control circuit comprising an impedance converter for providing a difference signal obtained from the input signal and an output signal of said tuning circuit.

* * * * *